(12) United States Patent
Meng et al.

(10) Patent No.: US 10,326,024 B2
(45) Date of Patent: Jun. 18, 2019

(54) THIN FILM TRANSISTOR, ARRAY SUBSTRATE, MANUFACTURING METHOD AND DISPLAY DEVICE

(71) Applicants: BOE TECHNOLOGY GROUP CO., LTD., Beijing (CN); HEFEI BOE OPTOELECTRONICS TECHNOLOGY CO., LTD., Hefei, Anhui (CN)

(72) Inventors: Qingchao Meng, Beijing (CN); Qiangqiang Luo, Beijing (CN)

(73) Assignees: BOE TECHNOLOGY GROUP CO., LTD., Beijing (CN); HEFEI BOE OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 131 days.

(21) Appl. No.: 14/378,491

(22) PCT Filed: Jun. 24, 2013

(86) PCT No.: PCT/CN2013/077730
§ 371 (c)(1),
(2) Date: Aug. 13, 2014

(87) PCT Pub. No.: WO2014/166168
PCT Pub. Date: Oct. 16, 2014

(65) Prior Publication Data
US 2016/0141424 A1    May 19, 2016

(30) Foreign Application Priority Data
Apr. 10, 2013   (CN) .......................... 2013 1 0123873

(51) Int. Cl.
*H01L 29/786*   (2006.01)
*H01L 29/45*    (2006.01)
(Continued)

(52) U.S. Cl.
CPC ...... *H01L 29/78642* (2013.01); *H01L 27/124* (2013.01); *H01L 29/167* (2013.01);
(Continued)

(58) Field of Classification Search
CPC ....... H01L 29/24; H01L 29/45; H01L 29/456; H01L 29/495; H01L 29/167;
(Continued)

(56) References Cited

U.S. PATENT DOCUMENTS 4,422,090 A * 12/1983 Shepherd .............. H01L 21/425
257/66
5,198,379 A *  3/1993 Adan ................ H01L 29/66477
257/E21.409
(Continued)

FOREIGN PATENT DOCUMENTS

| CN | 102082179 A | 6/2011 |
|---|---|---|
| CN | 103000693 A | 3/2013 |
| CN | 203420187 U | 2/2014 |

OTHER PUBLICATIONS

International Preliminary Report on Patentability dated Oct. 13, 2015, PCT/CN2013/077730.
(Continued)

*Primary Examiner* — Cheung Lee
*Assistant Examiner* — Stephen C Smith
(74) *Attorney, Agent, or Firm* — Ladas & Parry LLP

(57) ABSTRACT

A thin film transistor, an array substrate, a manufacturing method and a display device are provided. The thin film transistor includes a substrate and a gate layer, a source layer and a drain layer disposed on the substrate. The source layer and the drain layer are disposed in different layers and the drain layer and the gate layer are disposed in same and one layer.

13 Claims, 8 Drawing Sheets

(51) Int. Cl.
*H01L 29/66* (2006.01)
*H01L 29/49* (2006.01)
*H01L 29/167* (2006.01)
*H01L 29/417* (2006.01)
*H01L 29/423* (2006.01)
*H01L 29/51* (2006.01)
*H01L 29/24* (2006.01)
*H01L 27/12* (2006.01)

(52) U.S. Cl.
CPC ........ *H01L 29/24* (2013.01); *H01L 29/41733* (2013.01); *H01L 29/41741* (2013.01); *H01L 29/42364* (2013.01); *H01L 29/42372* (2013.01); *H01L 29/42384* (2013.01); *H01L 29/45* (2013.01); *H01L 29/456* (2013.01); *H01L 29/458* (2013.01); *H01L 29/495* (2013.01); *H01L 29/4908* (2013.01); *H01L 29/4966* (2013.01); *H01L 29/517* (2013.01); *H01L 29/6675* (2013.01); *H01L 29/66666* (2013.01); *H01L 29/66765* (2013.01); *H01L 29/66969* (2013.01); *H01L 29/7866* (2013.01); *H01L 29/7869* (2013.01); *H01L 29/78669* (2013.01)

(58) Field of Classification Search
CPC ............. H01L 29/517; H01L 29/78642; H01L 27/124; H01L 29/41733; H01L 29/41741; H01L 29/42364; H01L 29/4908; H01L 29/4966; H01L 29/66666; H01L 29/6675; H01L 29/66969; H01L 29/7866; H01L 29/7869
See application file for complete search history.

(56) References Cited

U.S. PATENT DOCUMENTS

| | | | |
|---|---|---|---|
| 6,184,946 B1* | 2/2001 | Ando | G02F 1/1368 257/E21.19 |
| 7,864,257 B2 | 1/2011 | Huh et al. | |
| 9,660,048 B2* | 5/2017 | Hwang | H01L 29/66462 |
| 2009/0159887 A1 | 6/2009 | Huh et al. | |
| 2010/0133539 A1 | 6/2010 | Kang et al. | |
| 2011/0193837 A1* | 8/2011 | Sato | H01L 27/124 345/205 |
| 2012/0018721 A1* | 1/2012 | Choi | H01L 29/78606 257/43 |
| 2013/0027627 A1* | 1/2013 | Kang | H01L 29/41733 349/46 |
| 2013/0092942 A1* | 4/2013 | Park | H01L 29/41758 257/57 |
| 2014/0097437 A1 | 4/2014 | Rhee et al. | |

OTHER PUBLICATIONS

Second Chinese Office Action dated Oct. 19, 2015; Appln. No. 201310123873.7.
First Chinese Office Action Appln. No. 201310123873.7; dated Feb. 23, 2015.
International Search Report Appln. No. PCT/CN2013/077730; dated Jan. 23, 2014.
Third Chinese Office Action dated Apr. 18, 2016; Appln. No, 201310123873.7.
Fourth Chinese Office Action dated Oct. 21, 2016; Appln. No. 201310123873.7.

\* cited by examiner

THIN FILM TRANSISTOR, ARRAY SUBSTRATE, MANUFACTURING METHOD AND DISPLAY DEVICE

TECHNICAL FIELD

The present invention relates to the field of display technology, in particular to a thin film transistor and an array substrate, their respective manufacturing methods and a display device comprising the array substrate.

BACKGROUND

With the development of science and technology, panel display devices have replaced bulky CRT (Cathode Ray Tube) display devices and have spread into people's everyday life. At present, common panel display devices include LCD (Liquid Crystal Display) and OLED (Organic Light-Emitting Diode) display devices.

During image formation, each pixel dot in the LCD display device and the active matrix OLED (AMOLED) display device is driven by thin film transistors (TFT) integrated in the array substrate to realize image display. Thin film transistors, as control switches, are critical for LCD display devices and OLED display devices in display and are directly related to the development direction of high performance display devices.

As illustrated in FIG. 1A, a thin film transistor comprises a substrate P1 and a gate layer P2 formed on the substrate P1, a gate insulating layer P4, an active layer and respective insulating layer (namely composite layer P5), a source layer P6 and a drain layer P3. At present, source and drain in a thin film transistor are typically disposed in same and one layer, for example, the drain layer P6 and the source layer P3 are formed with a gap or trench therebetween. Accordingly, in a known thin film transistor manufacturing process, the source and drain film layer is formed by a film formation step, and then the source and drain film layer is subjected to exposure, development, and etching steps to form a source and a drain with a gap or trench therebetween. Thus, a source and a drain separated from each other are formed in the same layer.

As illustrated in FIG. 1B, the array substrate comprises the above-mentioned thin film transistors (TFT) and a passivation layer P7, a pixel electrode layer P8, wherein the passivation layer P7 is disposed over the TFTs and further provided with a via P9, the pixel electrode layer P8 is disposed over the passivation layer P7, and the drain layer P3 and the pixel electrode layer P8 of the TFTs are connected with each other through the via P9.

However, being limited by the capabilities of a conventional equipments and processes, a channel (i.e., a conducting region between the source and the drain) is often not completely etched, thus the source and the drain may be bridge connected with each other. As a result, it causes defectiveness of bright spots for pixels, and lowers the product quality grades (for example, grade lowered from P level to S level). Therefore, how to ensure completely disconnection between the source and the drain of a thin film transistor and improve the quality of products has become a problem to be solved in the industry.

SUMMARY

An object of the present invention is to provide a thin film transistor, an array substrate, a manufacturing method and a display device in which source and drain in the thin film transistor and the corresponding array substrate can be completely disconnected, thereby avoiding bridge connection between the source and the drain and improving the product quality of the display device.

In accordance with a first aspect of the present invention, there is provided a thin film transistor comprising: a substrate; and a gate layer, a source layer and a drain layer disposed on the substrate, wherein the source layer and the drain layer are disposed in different layers and the drain layer and the gate layer are disposed in same and one layer.

In one example, the drain layer and the gate layer have a gap therebetween; the source layer is disposed over the gate layer, a gate insulating layer and a composite layer are disposed between the source layer and the gate layer, the gate insulating layer is disposed on the gate layer and under the composite layer, the composite layer extends over the gate insulating layer and a part of the drain layer and overlays the gap or trench.

In one example, the gate layer, the source layer and the drain layer are all formed of at least one material of molybdenum, molybdenum niobium alloy, aluminum, aluminum neodymium alloy, titanium or copper, and the gate layer, the source layer and the drain layer have thicknesses ranging from 2000 Å~10000 Å.

In one example, the composite layer comprises an active layer and an ohmic contact layer disposed on the active layer, the active layer is formed of a non-crystalline silicon material and has a thickness ranging from 200 Å~3000 Å, the ohmic contact layer is formed of a non-crystalline silicon material doped with phosphor element and has a thickness ranging from 200 Å~3000 Å.

In one example, the composite layer comprises an active layer and an etching stop layer disposed on the active layer, the active layer is formed of at least one material of indium gallium zinc oxide, indium zinc oxide, indium tin oxide or indium gallium tin oxide, and the active layer has a thickness ranging from 100 Å~2000 Å; the etching stop layer is formed of at least two materials of silicon oxide, silicon nitride, hafnium oxide, or aluminum oxide, and has a thickness ranging from 500 Å~4000 Å.

In one example, the gate insulating layer is a single, double or multiple layers and is formed of at least one material of silicon oxide, silicon nitride, hafnium oxide, silicon oxynitride, or aluminum oxide, and has a thickness ranging from 2000 Å~6000 Å.

According to a second aspect of the present invention, there is provided an array substrate comprising the above-mentioned thin film transistor.

In one example, the array substrate further comprises a passivation layer disposed over the source layer and the drain layer, wherein the passivation layer is provided with a via at a region corresponding to the drain layer, and the passivation layer is formed of at least two materials of silicon oxide, silicon nitride, hafnium oxide or aluminum oxide and has a thickness ranging from 1000 Å~4000 Å.

In one example, the array substrate further comprises a pixel electrode layer disposed on the passivation layer, wherein the drain layer is connected with the pixel electrode layer through the via, the pixel electrode layer is formed of at least one material of indium gallium zinc oxide, indium zinc oxide, indium tin oxide or indium gallium tin oxide, and has a thickness ranging from 300 Å~1500 Å.

In accordance with a third aspect of the present invention, there is provided a display device comprising the above-mentioned array substrate.

In accordance with a fourth aspect of the present invention, there is provided a method of manufacturing a thin film transistor comprising a step of forming a source layer and a drain layer in different layers and faulting a gate layer and a drain layer on same and one layer.

In one example, the step of forming a source layer and a drain layer in different layers and forming a gate layer and a drain layer in same and one layer comprises:

simultaneously forming patterns of the gate layer and the drain layer by one patterning process, and forming a pattern of the source layer by another patterning process.

In accordance with a fifth aspect of the present invention, there is provided a method of manufacturing a thin film transistor comprising:

forming patterns of a gate layer and a drain layer on a substrate, the gate layer and the drain layer having a gap or a trench therebetween;

forming a pattern of the gate insulating layer on the gate layer;

forming a pattern of a composite layer on the gate insulating layer and a part of the drain layer;

forming a pattern of a source layer on the composite layer at a region corresponding to the gate layer.

In one example, the step of forming patterns of a gate layer and a drain layer on a substrate, the gate layer and the drain layer having a gap or a trench therebetween comprises: forming an electrode metal film on the substrate and forming patterns of the gate layer and the drain layer by one patterning process.

In one example, the step of forming a pattern of a gate insulating layer on the gate layer comprises: forming a gate insulating layer film, and forming a pattern of the gate insulating layer on the gate layer by one patterning process.

In one example, the step of forming a pattern of the composite layer on the gate insulating layer and a part of the drain layer comprises: forming a composite layer film, the composite layer film comprising an active layer film and an ohmic contact layer film disposed on the active layer, and forming a pattern of the composite layer on the gate insulating layer and a part of the drain layer by one patterning process.

In one example, the step of forming a pattern of the composite layer on the gate insulating layer and a part of the drain layer comprises: forming a composite layer film, the composite layer film comprising an active layer film and an etching stop layer film disposed on the active layer, and forming a pattern of the composite layer on the gate insulating layer and a part of the drain layer by one patterning process.

In one example, the step of forming a pattern of the source layer on the composite layer at a region corresponding to the gate layer comprises: forming an electrode metal film, and forming a pattern of the source layer on the composite layer at a region corresponding to the gate layer by one patterning process.

In accordance with a sixth aspect of the present invention, there is provided a method of manufacturing an array substrate comprising the above-mentioned method of manufacturing the thin film transistor.

In one example, the following steps are further comprised:

forming a pattern of the passivation layer on the source layer, a part of the composite layer not covered by the source layer and a part of the drain layer not covered by the composite layer;

forming a via in the passivation layer, and forming a pattern of the pixel electrode layer on the passivation layer, the drain layer and the pixel electrode layer being connected with each other through the via.

In one example, the step of forming a pattern of the passivation layer on the source layer, a part of the composite layer not covered by the source layer and a part of the drain layer not covered by the composite layer comprises: forming a passivation layer film, and forming patterns of the passivation layer and the via on the source layer, a part of the composite layer not covered by the source layer and a part of the drain layer not covered by the composite layer by one patterning process.

In one example, the step of forming a via in the passivation layer, and forming a pattern of the pixel electrode layer on the passivation layer, the drain layer and the pixel electrode layer being connected with each other through the via comprises: forming a transparent conductive film, and forming a pattern of the pixel electrode layer on the passivation layer by one patterning process, the drain layer and the pixel electrode layer being connected with each other through the via.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 3e is a plan view of an array substrate formed with a source layer;

REFERENCE NUMERALS

P1,1—substrate; P2,2—gate layer; P3,3—drain layer; P4,4—gate insulating layer; P5,5—composite layer; 50—composite layer film; P6,6—source layer; 60—electrode metal film; P7,7—passivation layer; P8,8—pixel electrode layer; P9,9—via; 21—gate scan line; 61—data line.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Embodiment 1

The present embodiment provides a thin film transistor comprising:
a substrate; and
a gate layer, a source layer and a drain layer which are disposed on the substrate, the source layer and the drain layer being disposed in different layers, and the drain layer and the gate layer are disposed in same layer.

The present embodiment further provides an array substrate comprising the above-mentioned thin film transistor.

Figure 1A:
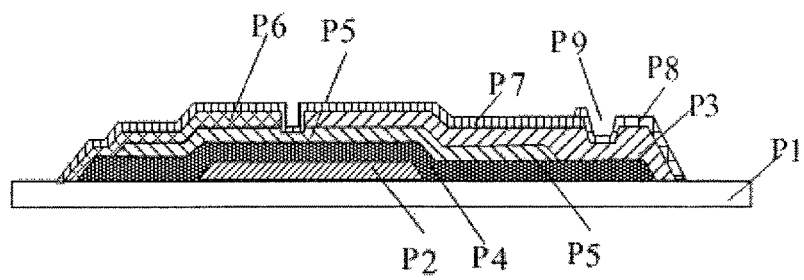
FIG. 1A is a schematically sectional view of a known thin film transistor.
Figure 1B:
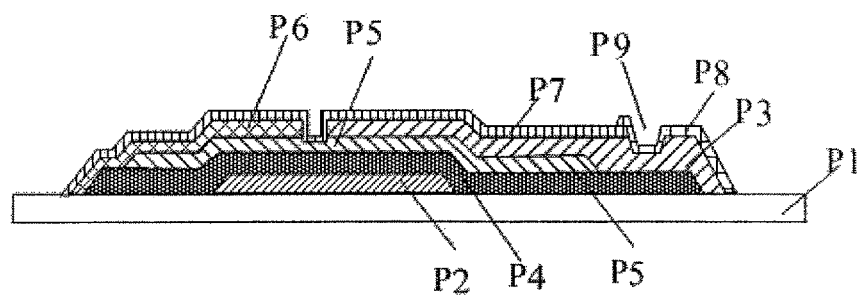
FIG. 1B is a schematically sectional view of a known array substrate.
Figure 2:
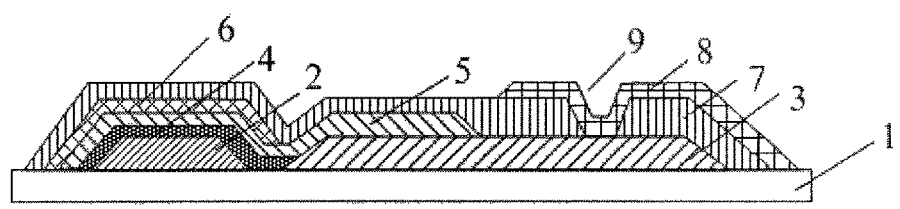
FIG. 2 is a schematically sectional view of an array substrate in Embodiment 1 of the present invention.

As illustrated in FIG. 2, in the thin film transistor, the drain layer 3 and the gate layer 2 are disposed on the substrate 1 and in the same layer, the drain layer 3 and the gate layer 2 are provided with a gap or a trench therebetween. The source layer 6 is disposed over the gate layer 2. A gate insulating layer 4 and a composite layer 5 are disposed between the source layer 6 and the gate layer 2. The gate insulating layer 4 is disposed on the gate layer 2 and under the composite layer 5. The composite layer 5 extends over the gate insulating layer 4 and a part of the drain layer 3, and overlays the gap or trench.

The gate layer 2, the source layer 6 and the drain layer 3 may all be made of at least one material of molybdenum, molybdenum niobium alloy, aluminum, aluminum neodymium alloy, titanium or copper, and the gate layer 2, the source layer 6 and the drain layer 3 have thickness ranging from 2000 Å~10000 Å.

In this embodiment, the composite layer 5 comprises an active layer and an etching stop layer disposed on the active layer. The active layer is made of at least one material of indium gallium zinc oxide, indium zinc oxide, indium tin oxide or indium gallium tin oxide, and the active layer has a thickness ranging from 100 Å~2000 Å; the etching stop layer may be formed of at least two materials of silicon oxide, silicon nitride, hafnium oxide, or aluminum oxide, and has a thickness ranging from 500 Å~4000 Å.

The gate insulating layer 4 may be a single, double or multiple layers and may be formed of at least one material of silicon oxide, silicon nitride, hafnium oxide, silicon oxynitride, or aluminum oxide, and has a thickness ranging from 2000 Å~6000 Å.

The array substrate in the present embodiment comprises the above-mentioned TFTs and further comprises a passivation layer 7 and a pixel electrode layer 8. The passivation layer 7 is disposed on the source layer 6 and the drain layer 3, and provided with a via 9 at a region corresponding to the drain layer 3. The passivation layer 7 may be formed of at least two materials of silicon oxide, silicon nitride, hafnium oxide or aluminum oxide and has a thickness ranging from 1000 Å~4000 Å.

The pixel electrode layer 8 is disposed on the passivation layer 7, the drain layer 3 is connected with the pixel electrode layer 8 through the via 9. The pixel electrode layer 8 may be formed of at least one material of indium gallium zinc oxide, indium zinc oxide, indium tin oxide or indium gallium tin oxide, and has a thickness ranging from 300 Å~1500 Å.

Accordingly, a method of the above-mentioned thin film transistor comprises a step of forming the gate layer 2 and the drain layer 3 in the same and one layer. Besides that, the manufacturing method further comprises a step of forming the passivation layer 7 and the via 9, and connecting the drain layer 3 and the pixel electrode layer 8 through the via 9.

In one example, the manufacturing method of thin film transistor comprises a step of forming patterns on the substrate 1 through two patterning process, wherein the patterns comprise the gate layer 2, the drain layer 3 and the source layer 6. One of the two patterning process is used to form a pattern comprising the gate layer 2 and the drain layer 3 at the same time, and the another patterning process is used to form a pattern comprising the source layer 6.

In the present invention, the patterning process may comprise only a photolithographic process, or comprise photolithographic process and etching process, moreover, it may further comprise other processes for forming predetermined patterns, such as printing, ink jet and the like. The photolithographic process refers to the process for forming patterns, which comprises film formation, exposure, development and the other processes, and adopts photoresist, mask, and exposure machine. Specific patterning process may be selected depending on the structure to be formed in the present invention.

As illustrated in FIGS. 3A-3h, the above-mentioned manufacturing method of array substrate comprises for example the following steps (wherein steps S1)-S5) are those for forming the thin film transistor):

Step S1): forming a pattern comprising a gate layer 2 and a drain layer 3 on the substrate 1 with a gap or trench between the gate layer 2 and the drain layer 3.

Figure 3A:
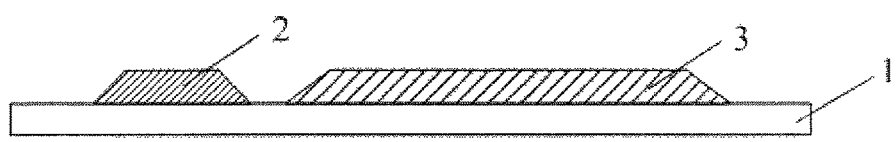
FIGS. 3A and 3a are schematically sectional view and plan view of an array substrate formed with a gate layer and a drain layer respectively.
Figure 3A:
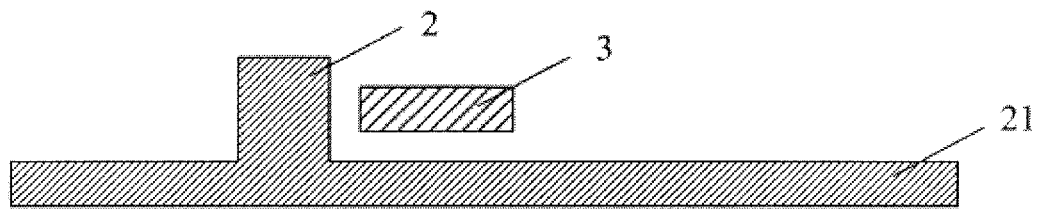

In this step, an electrode metal film is first formed on the substrate 1, and then forming a pattern comprising a gate layer 2, a gate scan line 21 and a drain layer 3 by one patterning process using a mask, as illustrated in FIGS. 3A, and 3a. Here, the electrode metal film may be formed on the substrate 1 by deposition, sputtering or thermal evaporation.

Here, in order to clearly illustrate the sectional structure of the array substrate in the present embodiment during a manufacturing process more prominently, the scales of sectional views 3A and plan view 3a are set to be different. At the same time, to facilitate understanding positional relationship between respective layers in the thin film transistor, layers in the plan views are set to be transparent to a certain degree. The following plan views and sectional views are shown in a same way.

Step S2): forming a pattern comprising a gate insulating layer 4 on the gate layer 2.

Figure 3B:
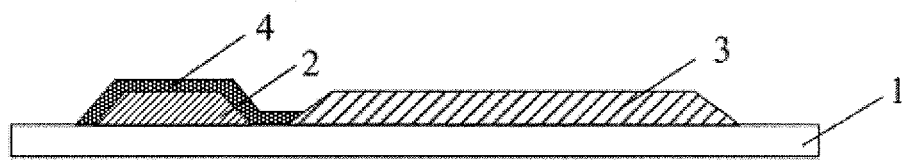
FIGS. 3B and 3b are schematically sectional view and plan view of an array substrate formed with a gate insulating layer respectively.
Figure 3B:
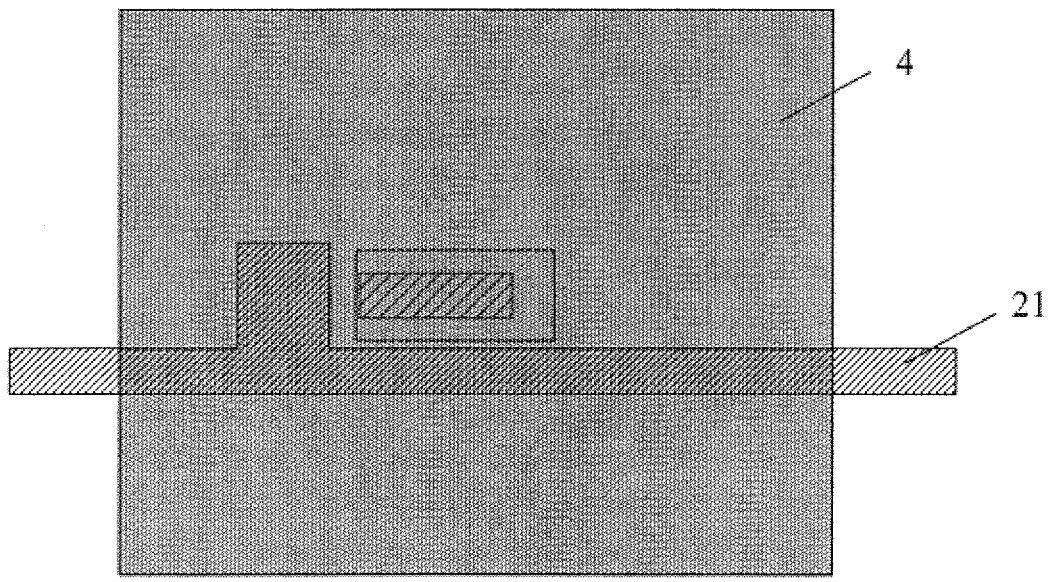

In this step, a gate insulating layer film is formed on the substrate 1 with completion of step S1), that is, a gate insulating layer 4 is formed on the gate layer 2, as illustrated in FIGS. 3B and 3b. The gate insulating layer film may be formed by plasma enhanced chemical vapor deposition, and the gate insulating layer 4 may be formed by one photolithographic process using a mask.

Step S3): forming a pattern comprising the composite layer 5 on the gate insulating layer 4 and a part of the drain layer 3.

Figure 3C:
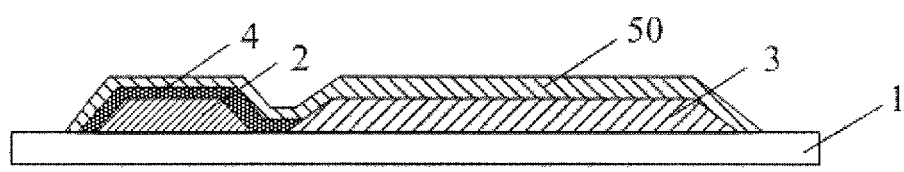
FIG. 3C-3E are schematically sectional views of an array substrate formed with a source layer.
Figure 3D:
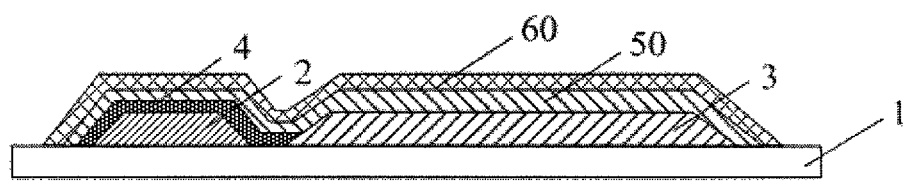
Figure 3E:
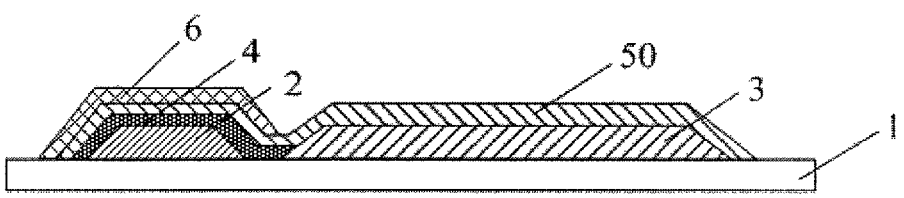
Figure 3E:
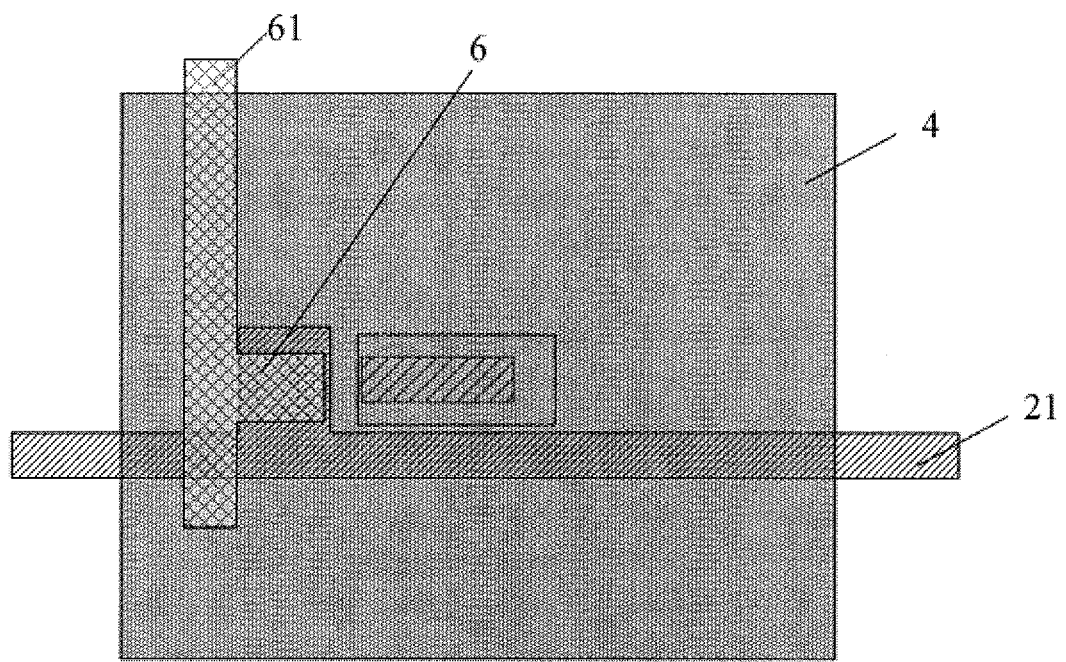
Figure 3F:
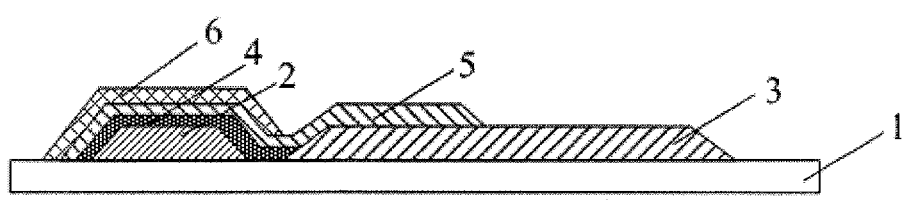
FIGS. 3F and 3f are schematically sectional view and plan view of an array substrate formed with a composite layer respectively.
Figure 3F:
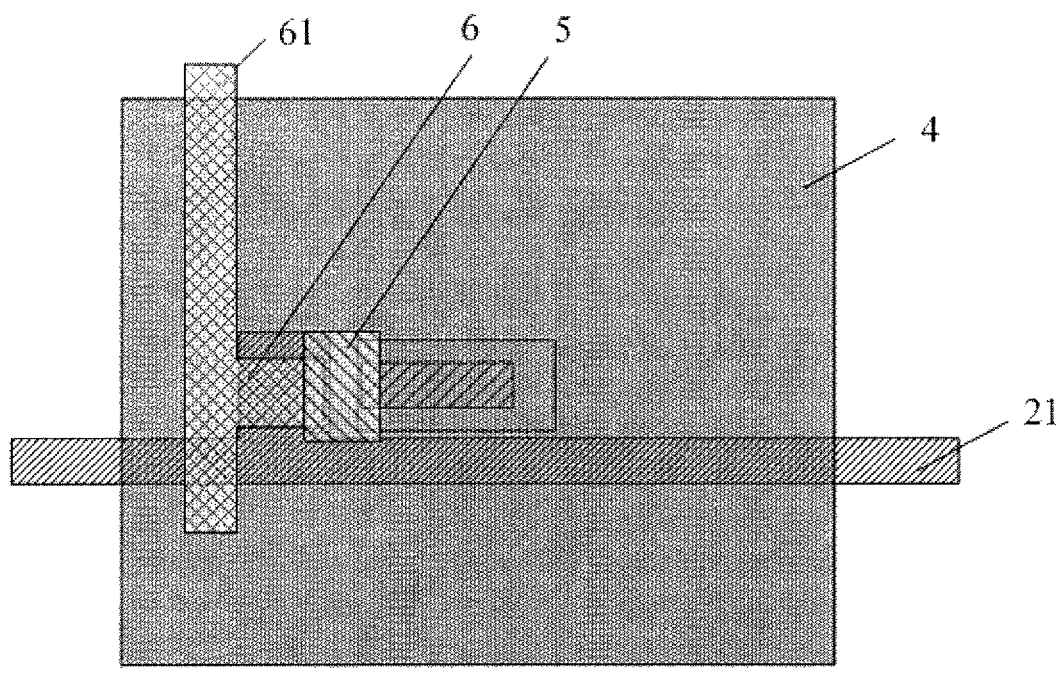

In this step, a composite layer film 50 is formed on the substrate 1 with completion of step S2). The composite layer film may be formed by deposition, sputtering or thermal evaporation. As illustrated in FIG. 3C, the composite layer film 50 comprises an active layer film and an etching stop layer film disposed on the active layer film (the two layer films are deposited respectively during the preparation process). A pattern comprising the composite layer 5 is formed on the gate insulating layer 4 and the part of the drain layer 3 by one patterning process using a mask, as illustrated in FIGS. 3F and 3f. Of course, it is also possible to use other masks that can realize this structure, for example, a halftone mask.

Step S4): forming a pattern comprising the source layer 6 on the composite layer 5 at a region corresponding to the gate layer 2.

In this step, an electrode metal film 60 is formed on the substrate 1 with completion of step S3). As illustrated in FIG. 3D, a pattern comprising the source layer 6 and a data line 61 is formed on the composite layer 5 at regions corresponding to the gate layer 2 by one patterning process using a mask, as illustrated in FIGS. 3E and 3e. Here, the electrode metal film is formed on the substrate by deposition, sputtering or thermal evaporation. Of course, other masks that can realize this structure may also be used.

It is understood that in order to simplify the process flow, in steps S3) and S4), it is possible to form the composite layer film 50 first (as illustrated in FIG. 3C), and then form the electrode metal film 60 (as illustrated in FIG. 3D); next, an upper layer pattern comprising a source layer 6 and a data line 61 is formed by patterning process (as illustrated in FIGS. 3E and 3e), and then a lower layer pattern comprising the composite layer 5 is formed by patterning process. Specific steps will not be described in detail here.

So far, the thin film transistor is finished. The gate scan line 21 and the data line 61 are formed in advance, which facilitates wiring of the array substrate.

Step S5): forming patterns comprising the passivation layer 7 and the via 9 on the source layer 6, the part of the composite layer 5 not covered by the source layer 6 as well as the part of the drain layer 3 not covered by the composite layer 5.

Figure 3G:
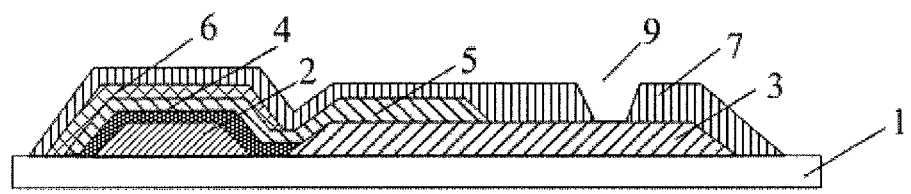
FIGS. 3G and 3g are schematically sectional view and plan view of an array substrate formed with a passivation layer and a via respectively.
Figure 3G:
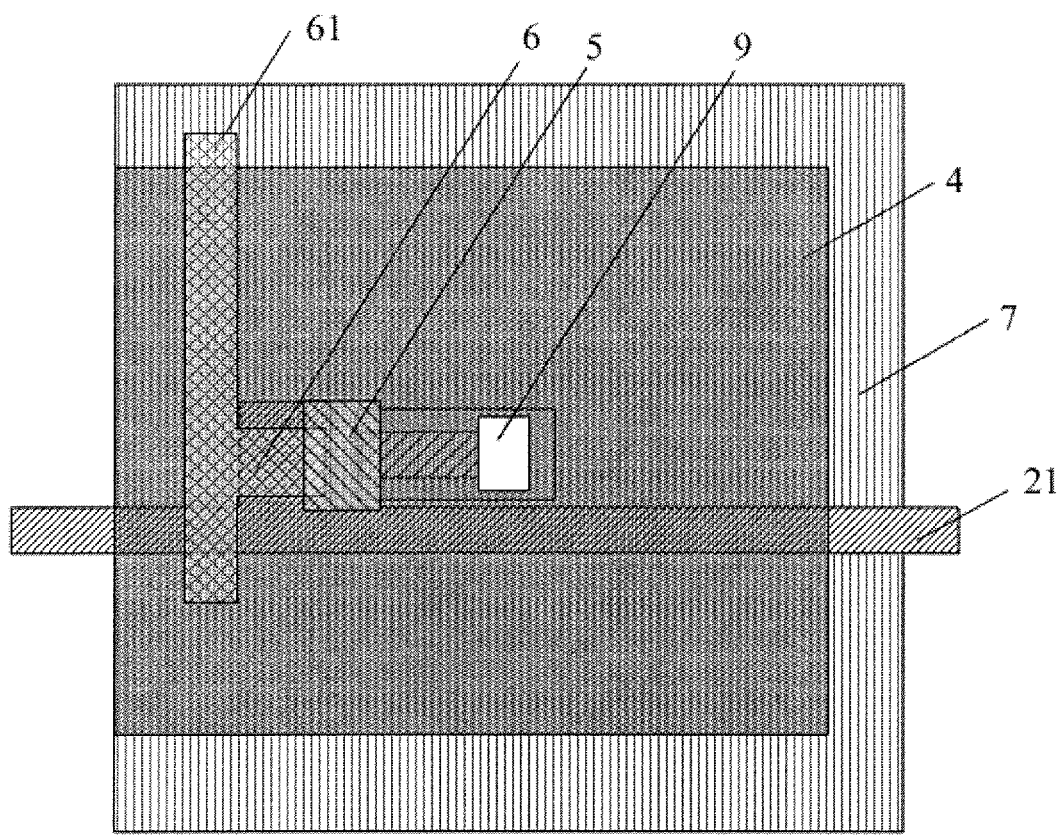
Figure 3H:
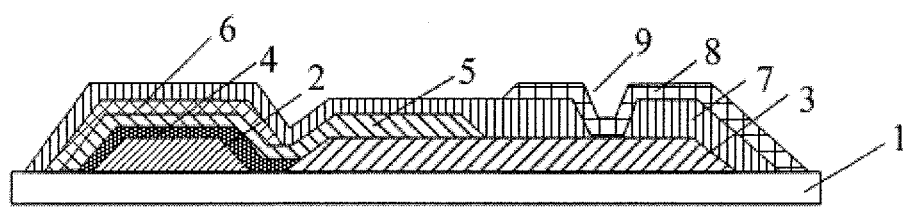
FIGS. 3H and 3h are schematically sectional view and plan view of an array substrate formed with a pixel electrode layer respectively.
Figure 3H:
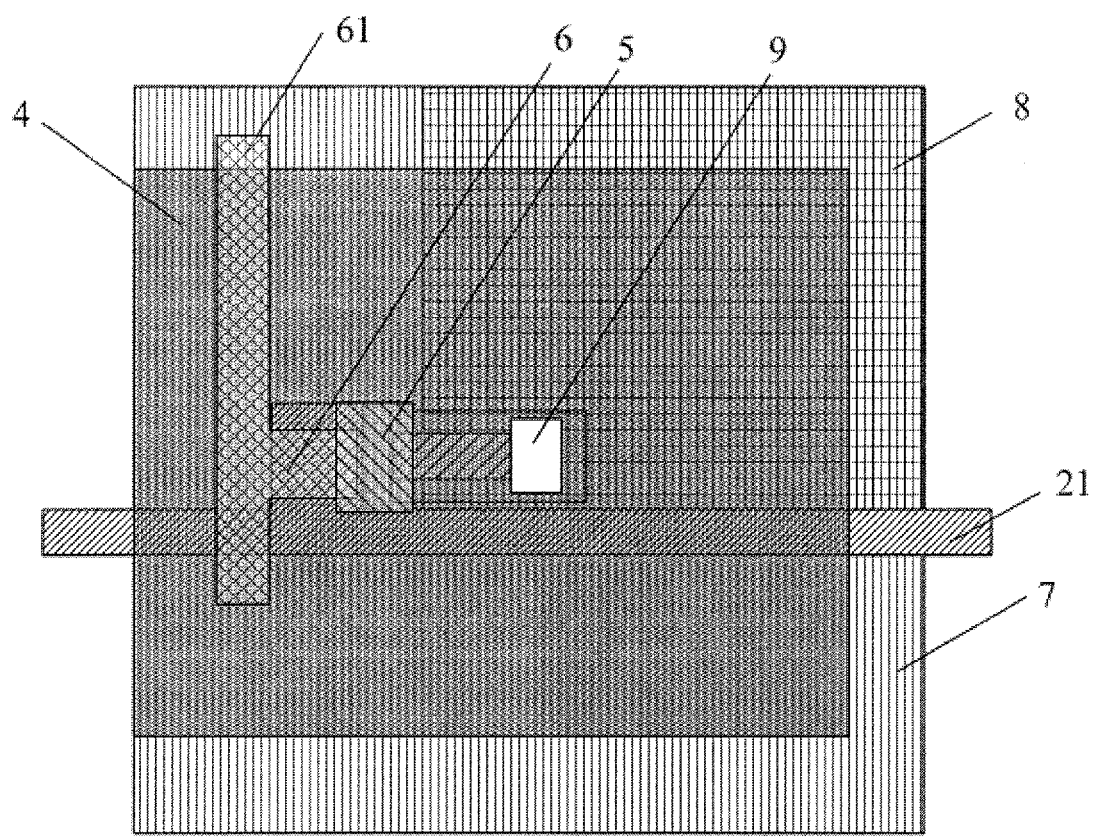

In this step, the passivation layer film (PVX) is formed on the substrate 1 with completion of step S4), and then a pattern comprising the passivation layer 7 is formed on the source layer 6, the part of the composite layer 5 not covered by the source layer 6 and the part of the drain layer not covered by the composite layer 5 by one patterning process using a mask, and then a pattern comprising the via 9 is formed in the passivation layer 7 by etching (FIGS. 3g and 3G). Here, the passivation layer film is formed by deposition, sputtering or thermal evaporation. Of course, other masks that can realize this structure may be used.

Step S6): forming a pattern comprising the pixel electrode layer 8 on the passivation layer 7, the drain layer 3 and the pixel electrode layer 8 being connected with each other through the via 9.

In this step, a transparent conductive film is formed on the substrate 1 with completion of step S5), and then a pattern comprising the pixel electrode layer 8 is formed on the passivation layer 7 by one patterning process using a mask, and the drain layer 3 and the pixel electrode layer 8 are connected through the via 9. Here, the transparent conductive film is formed by deposition, sputtering or thermal evaporation. Of course, other masks that can realize this structure may be used.

In the present embodiment, the active layer of the thin film transistor is formed of metal oxide semiconductor, such as at least one material of indium gallium zinc oxide (IGZO), indium zinc oxide, indium tin oxide, or indium gallium tin oxide, such that the electron mobility between the source layer and the drain layer is increased, therefore better electron mobility between the source layer and the drain layer is achieved.

Figure 4:
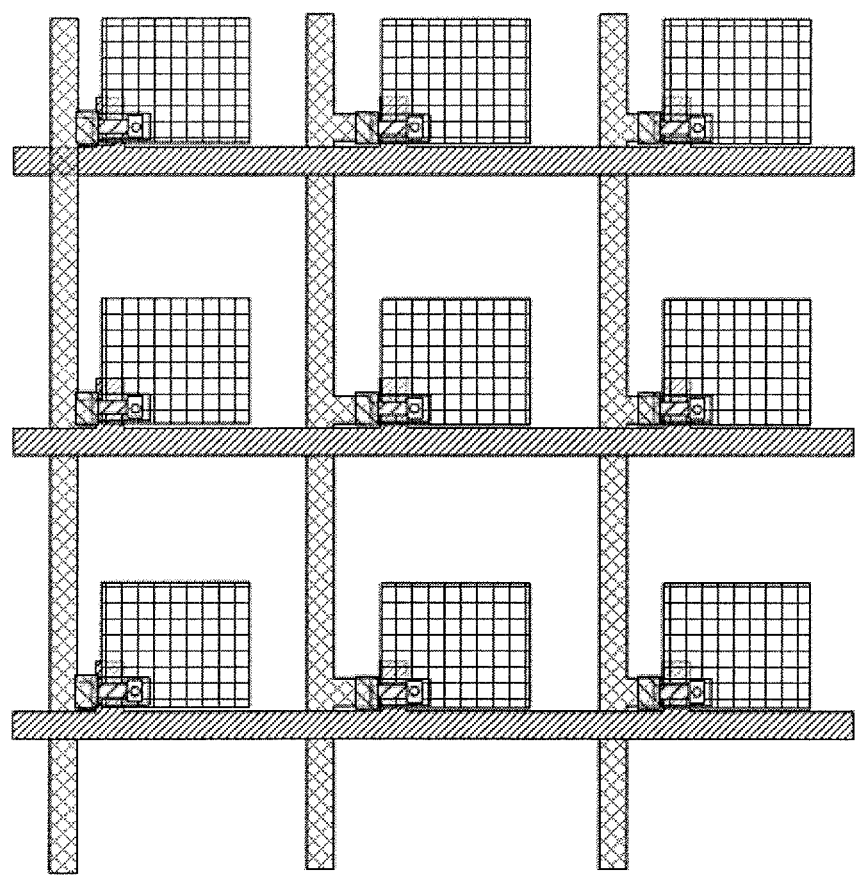
FIG. 4 is a plan view of an array substrate formed with a plurality of TFT arranged as an array.

The present embodiment further provides a display device comprising the above-mentioned array substrate. As illustrated in FIG. 4, a plurality of TFTs are disposed as an array on the array substrate.

Embodiment 2

The present embodiment is different from Embodiment 1 in that the active layer in both the thin film transistor and corresponding array substrate in the present embodiment is formed of non-crystalline silicon material.

In this embodiment, the composite layer comprises an active layer and an ohmic contact layer disposed on the active layer. The active layer is formed of non-crystalline silicon material and has a thickness ranging from 200 Å~3000 Å. The ohmic contact layer is formed of a non-crystalline silicon material doped with phosphor element and has a thickness ranging from 200 Å~3000 Å.

The manufacturing method of the TFT array substrate in this embodiment is similar with those described in Embodiment 1, except that the step S3) is: forming a pattern comprising the composite layer on the substrate with completion of step S2), the composite layer comprises an active layer and an ohmic contact layer disposed on the active layer (the two layers are deposited respectively during the preparation process). For example, a composite layer is formed on the gate insulating layer and a part of the drain layer by one patterning process using a mask.

In this embodiment, the active layer is formed of non-crystalline silicon material, therefore the electron mobility between the source layer and the drain layer is smaller than the electron mobility in Embodiment 1.

In the thin film transistor and corresponding array substrate in Embodiments 1 and 2, by forming the source and the drain on different layers respectively (specifically, the drain layer and the gate layer are made in the same layer, and the source layer and the data line are made in the same layer), the step of forming a channel between the source layer and the drain layer by etching will not be needed in the manufacturing methods of thin film transistor and array substrate, thereby totally avoiding bridge connection of source and drain, reducing bright spots caused by poor pixels due to process problem and improving yield of the products.

What are described above is related to the illustrative embodiments of the disclosure only and not limitative to the scope of the disclosure; the scopes of the disclosure are defined by the accompanying claims.

The invention claimed is:

1. An array substrate, comprising: a substrate; and a gate electrode, a source electrode and a drain electrode disposed on the substrate, wherein the source electrode and the drain electrode are disposed different layers, and the drain electrode and the gate electrode are disposed in same and one layer;

the drain electrode and the gate electrode have a gap or a trench therebetween; the source electrode is disposed over the gate electrode, a gate insulating layer and a composite layer are disposed between the source electrode and the gate electrode, the gate insulating layer is disposed on the gate electrode and under the composite layer, the composite layer extends over the gate insulating layer and a part of the drain electrode and overlays the gap or trench;

the array substrate further comprises a passivation layer and a pixel electrode, the passivation layer is disposed on the source electrode and the drain electrode, and provided with a via at a region corresponding to the drain electrode, the pixel electrode is disposed on the passivation layer, and the drain electrode is connected with the pixel electrode through the via;
a projection of the source electrode on the substrate is overlapped with a projection of the gate electrode on the substrate.

2. The array substrate of claim 1, wherein the composite layer comprises an active layer and an ohmic contact layer disposed on the active layer, the active layer is formed of a non-crystalline silicon material and has a thickness ranging from 200 Å~3000 Å, the ohmic contact layer is formed of a non-crystalline silicon material doped with phosphor element and has a thickness ranging from 200 Å~3000 Å.

3. The array substrate of claim 1, wherein the composite layer comprises an active layer and an etching stop layer disposed on the active layer, the active layer is formed of at least one material of indium gallium zinc oxide, indium zinc oxide, indium tin oxide or indium gallium tin oxide, and the active layer has a thickness ranging from 100 Å~2000 Å; the etching stop layer is formed of at least two materials of silicon oxide, silicon nitride, hafnium oxide, or aluminum oxide, and has a thickness ranging from 500 Å~4000 Å.

4. The array substrate of claim 1, wherein the gate insulating layer is a single, double or multiple layers and is formed of at least one material of silicon oxide, silicon nitride, hafnium oxide, silicon oxynitride or aluminum oxide, and has a thickness ranging from 2000 Å~6000 Å.

5. A method of manufacturing the array substrate according to claim 1, comprising:
forming patterns of the gate electrode and the drain electrode on the substrate, the gate electrode and the drain electrode having a gap or a trench therebetween;
forming a pattern of the gate insulating layer on the gate electrode;
forming a pattern of the composite layer on the gate insulating layer and a part of the drain electrode;
forming a pattern of a source electrode on the composite layer at a region corresponding to the gate electrode;
forming a pattern of the passivation layer on the source electrode, a part of the composite layer not covered by the source electrode and a part of the drain electrode not covered by the composite layer;
forming the via in the passivation layer, and forming a pattern of the pixel electrode on the passivation layer, the drain electrode and the pixel electrode being connected with each other through the via.

6. The method of claim 5, wherein the step of forming patterns of the a gate electrode and the drain electrode on the substrate, the gate electrode and the drain electrode having a gap or a trench therebetween comprises: forming an electrode metal film on the substrate and forming patterns of the gate electrode and the drain electrode by one patterning process.

7. The method of claim 6, wherein the step of forming the pattern of the gate insulating layer on the gate electrode comprises: forming a gate insulating layer film, and forming a pattern of the gate insulating layer on the gate electrode by one patterning process.

8. The method of claim 7, wherein the step of forming a pattern of the composite layer on the gate insulating layer and a part of the drain electrode comprises: forming a composite layer film, the composite layer film comprising an active layer film and an ohmic contact layer film disposed on the active layer, and forming a pattern of the composite layer on the gate insulating layer and a part of the drain electrode by one patterning process.

9. The method of claim 7, wherein the step of forming a pattern of the composite layer on the gate insulating layer and a part of the drain electrode comprises: forming a composite layer film, the composite layer film comprising an active layer film and an etching stop layer film disposed on the active layer, and forming a pattern of the composite layer on the gate insulating layer and a part of the drain electrode by one patterning process.

10. The method of claim 9, wherein the step of forming a pattern of the source electrode on the composite layer at a region corresponding to the gate electrode comprises: forming an electrode metal film, and forming a pattern of the source electrode on the composite layer at a region corresponding to the gate electrode by one patterning process.

11. The method of claim 8, wherein the step of forming a pattern of the source electrode on the composite layer at a region corresponding to the gate electrode comprises: forming an electrode metal film, and forming a pattern of the source electrode on the composite layer at a region corresponding to the gate electrode by one patterning process.

12. The array substrate of claim 1, wherein the gate electrode, the source electrode and the drain electrode are all formed of at least one material of molybdenum, molybdenum niobium alloy, titanium or copper, and the gate electrode, the source electrode and the drain electrode have thicknesses ranging from 2000 Å~10000 Å.

13. The array substrate of claim 1, wherein the source electrode is in direct contact with the composite layer; the drain electrode is in direct contact with the composite layer.

* * * * *